US011374173B2

(12) United States Patent
Liu et al.

(10) Patent No.: US 11,374,173 B2
(45) Date of Patent: Jun. 28, 2022

(54) EVAPORATION MASK, OLED PANEL AND SYSTEM, AND EVAPORATION MONITORING METHOD

(71) Applicant: KUNSHAN GO-VISIONOX OPTO-ELECTRONICS CO., LTD., Kunshan (CN)

(72) Inventors: Mingxing Liu, Kunshan (CN); Junfeng Li, Kunshan (CN); Xuliang Wang, Kunshan (CN); Feng Gao, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 671 days.

(21) Appl. No.: 16/323,062

(22) PCT Filed: Apr. 28, 2018

(86) PCT No.: PCT/CN2018/085015
§ 371 (c)(1),
(2) Date: Feb. 4, 2019

(87) PCT Pub. No.: WO2019/062116
PCT Pub. Date: Apr. 4, 2019

(65) Prior Publication Data
US 2021/0336146 A1 Oct. 28, 2021

(30) Foreign Application Priority Data
Sep. 29, 2017 (CN) .......................... 201710910812.3

(51) Int. Cl.
*H01L 51/00* (2006.01)
*C23C 14/04* (2006.01)
(Continued)

(52) U.S. Cl.
CPC .......... *H01L 51/0011* (2013.01); *C23C 14/04* (2013.01); *C23C 14/24* (2013.01);
(Continued)

(58) Field of Classification Search
CPC . H01L 51/56; H01L 2251/56; H01L 27/3225; H01L 27/3246; H01L 51/0031;
(Continued)

(56) References Cited

U.S. PATENT DOCUMENTS 9,224,957 B1 * 12/2015 Kang .................. H01L 27/3223
2005/0244570 A1 * 11/2005 Tanase .................... C23C 14/26
427/248.1
(Continued)

FOREIGN PATENT DOCUMENTS

| CN | 1234906 C | 1/2006 |
| CN | 102482760 A | 5/2012 |

(Continued)

OTHER PUBLICATIONS

International Search Report dated Aug. 2, 2018 in corresponding International application No. PCT/CN2018/085015; 5 pages including Partial English-language translation.
(Continued)

*Primary Examiner* — Jaehwan Oh
(74) *Attorney, Agent, or Firm* — Maier & Maier, PLLC

(57) ABSTRACT

An evaporation mask, an organic light-emitting diode (OLED) panel and system, and an evaporation monitoring method. The evaporation mask includes a first functional region and a first peripheral region disposed outside of the first functional region. The first functional region has a first opening for forming a functional layer by evaporation, and the first peripheral region has a second opening for monitoring an evaporation effect of the first opening. A monitoring structure can be formed on an observation layer of the
(Continued)

OLED panel by evaporation through the second opening of the evaporation mask, and the evaporation effect of the first opening of the evaporation mask can be monitored via the monitoring structure, so that the evaporation effect can be monitored in time to achieve real-time on-line monitoring.

14 Claims, 4 Drawing Sheets

(51) Int. Cl.
    *C23C 14/24*     (2006.01)
    *C23C 14/54*     (2006.01)
    *H01L 51/56*     (2006.01)

(52) U.S. Cl.
    CPC ............ *C23C 14/547* (2013.01); *H01L 51/56* (2013.01); *H01L 2251/56* (2013.01)

(58) Field of Classification Search
    CPC ........... H01L 2251/558; H01L 51/0008; C23C 14/042; C23C 14/044; C23C 14/24; C23C 14/545
See application file for complete search history.

(56) References Cited

U.S. PATENT DOCUMENTS

| | | | |
|---|---|---|---|
| 2008/0284690 A1* | 11/2008 | Ko | H01L 27/3218 345/76 |
| 2012/0183676 A1* | 7/2012 | Sonoda | C23C 14/042 118/712 |
| 2016/0043319 A1* | 2/2016 | White | H01L 51/0012 359/230 |
| 2016/0343944 A1 | 11/2016 | Lee et al. | |
| 2017/0110661 A1 | 4/2017 | Lee | |
| 2021/0336146 A1* | 10/2021 | Liu | C23C 14/042 |

FOREIGN PATENT DOCUMENTS

| | | |
|---|---|---|
| CN | 204714884 U | 10/2015 |
| CN | 105280842 A | 1/2016 |
| CN | 105702880 A | 6/2016 |
| CN | 106086786 A | 11/2016 |
| CN | 106129270 A | 11/2016 |
| CN | 206015074 U | 3/2017 |
| CN | 106637074 A | 5/2017 |
| JP | 2006216475 A | 8/2006 |
| JP | 2009-158328 A | 7/2009 |
| JP | 2013-211139 A | 10/2013 |
| JP | 2013209700 A | 10/2013 |
| KR | 2003-0081735 A | 10/2003 |
| TW | I223007 B | 11/2004 |
| TW | I579396 B | 4/2017 |
| WO | 2017138166 A1 | 8/2017 |

OTHER PUBLICATIONS

Office Action dated Jul. 7, 2020 in corresponding Japanese Application No. 2019-562456; 8 pages including English-language translation.

Korean Office Action dated Jun. 17, 2020, in connection with corresponding KR Application No. 10-2019-7021580 (19 pgs., including machine-generated English translation).

Office Action dated Aug. 14, 2019, in corresponding Chinese Application No. 201710910812.3 including partial machine-generated English language translation; 16 pages.

Extended European Search Report dated Oct. 28, 2020, in connection with corresponding EP Application No. 18863666.6; 11 pages.

Office Action dated Jan. 18, 2022, in connection with corresponding Japanese Application No. 2019-562456 (8 pp., including machine-generated English translation).

* cited by examiner

EVAPORATION MASK, OLED PANEL AND SYSTEM, AND EVAPORATION MONITORING METHOD

CROSS-REFERENCE TO RELATED APPLICATION

The application claims the benefit of priority of Chinese Patent Application No. 201710910812.3, filed on Sep. 29, 2017, and the entire disclosures of which are incorporated herein.

TECHNICAL FIELD

The present application relates to the technical field of OLED, and in particular, to an evaporation mask, an OLED panel and system, and an evaporation monitoring method.

BACKGROUND

Organic light-emitting diode (OLED) display technology is a novel display and illumination technology. In recent years, investment for OLED devices has gradually increased, and thus the OLED devices have become a hot spot in the industry.

In a manufacturing process of an OLED device, an organic material layer is formed by vacuum evaporation regularly using an evaporation mask. The evaporation mask usually includes a sheet mask having a pattern. During the vacuum evaporation, an organic material (heated and sublimated) passes through the pattern and then reaches a substrate to form an organic material layer on the substrate.

The evaporation effect is very important to the manufacture of OLED devices. In the prior art, the evaporation effect (mainly including evaporation offset) cannot be monitored in time, each evaporation result is only spot checked through manual inspection using microscopes, and this method is time-consuming and labor-consuming, and fails to monitor the evaporation process all the time. Therefore, it has been a problem to be solved by those skilled in the art to provide a relatively real-time monitoring method of evaporation.

SUMMARY

It is an object of the present application to provide an evaporation mask, an OLED panel and system, and an evaporation monitoring method to solve the problem that the evaporation process cannot be monitored in time in the prior art.

In order to solve the above technical problem, the present application provides an evaporation mask, including a first functional region and a first peripheral region disposed outside of the first functional region, the first functional region defining at least one first opening for forming a functional layer on an OLED panel by evaporation, the first peripheral region defining at least one second opening for forming a monitoring structure on the OLED panel by evaporation, an evaporation effect of the at least one first opening being monitored via the monitoring structure.

Alternatively, in the evaporation mask, a size of the at least one second opening is substantially same to a size of the at least one first opening.

Alternatively, in the evaporation mask, the shape of the at least one second opening is substantially same to that of the at least one first opening.

Alternatively, in the evaporation mask, the first peripheral region has a first edge and a second edge opposite to the first edge, wherein the first edge is closer to the first functional region than the second edge to the first functional region, and each of the second openings is closer to the first edge than to the second edge.

Alternatively, in the evaporation mask, the at least one second opening comprises a plurality of second openings distributed in the first peripheral region equably.

Alternatively, in the evaporation mask, the evaporation mask further includes a sheet mask and a support strip for supporting the sheet mask, wherein the at least one first opening and the plurality of second openings are located on the sheet mask, and the support strip has at least one third opening exposing at least one of the plurality of second openings corresponding to the at least one third opening.

Alternatively, in the evaporation mask, the support strip exposes all the second openings.

The present application further provides an OLED panel, including a second functional region and a second peripheral region disposed outside of the second functional region, the second peripheral region having an observation layer formed thereon, the second functional region having a functional layer formed thereon by evaporation through at least one first opening of an evaporation mask, the observation layer of the OLED panel having at least one monitoring structure formed thereon by evaporation through at least one second opening of the evaporation mask, an evaporation effect of the at least one first opening being monitored via the monitoring structure.

Alternatively, in the OLED panel, a color of the observation layer is greatly different from a color of the monitoring structures.

Alternatively, in the OLED panel, the observation layer is made of a reflective material.

Alternatively, in the OLED panel, the thickness of the observation layer is from 100 nm to 200 nm.

Alternatively, in the OLED panel, a height difference between a surface of the second peripheral region and a surface of the second functional region is less than or equals to 200 nm.

The present application further provides an OLED panel system, including: an evaporation mask comprising a first functional region and a first peripheral region disposed outside of the first functional region, the first functional region defining at least one first opening, the first peripheral region defining at least one second opening; and an OLED panel, arranged above the evaporation mask. The OLED panel includes a second functional region and a second peripheral region disposed outside of the second functional region, the second peripheral region having an observation layer formed thereon, the second functional region of the OLED panel having a functional layer formed thereon by evaporation through the at least one first opening of the evaporation mask, the observation layer of the OLED panel having at least one monitoring structure formed thereon by evaporation through the at least one second opening of the evaporation mask, an evaporation effect of the at least one first opening being monitored via the monitoring structure.

The present application further provides an evaporation monitoring method, including:

providing an evaporation mask, the evaporation mask comprising a first functional region and a first peripheral region disposed outside of the first functional region, the first functional region defining at least one first opening, and the first peripheral region defining at least one second opening;

providing an OLED panel, the OLED panel comprising a second functional region and a second peripheral region disposed outside of the second functional region, the second peripheral region having an observation layer formed thereon;

forming a functional layer and at least one monitoring structure on the second functional region and the observation layer of the OLED panel respectively using the evaporation mask;

acquiring an actual center of the at least one monitoring structure on the OLED panel; and comparing the actual center of the monitoring structure with a theoretical center of the monitoring structure to obtain an evaporation effect of the at least one first opening of the evaporation mask.

Alternatively, in the evaporation monitoring method, when the actual centers of the monitoring structures and the theoretical centers of the monitoring structures are at the same positions, the evaporation through the at least one first opening has no offset; and when the actual centers of the monitoring structures and the theoretical centers of the monitoring structures are at different positions, the evaporation through the at least one first opening has offset.

Alternatively, in the evaporation monitoring method, the comparison of actual centers and theoretical centers of the monitoring structures is achieved by comparing coordinates of the two.

In the evaporation mask, the OLED panel and system and the evaporation monitoring method provided by the present application, the monitoring structure can be formed on the observation layer of the OLED panel by evaporation through the second opening of the evaporation mask, and then the evaporation effect of the first opening of the evaporation mask can be monitored through the monitoring structure, so that the evaporation effect is able to be monitored in time to achieve real-time on-line monitoring.

In the figures,

100—evaporation mask; 110—sheet mask; 110a—first functional region; 110b—first peripheral region; 111—first opening; 112—second opening; L1—first edge; L2—second edge;

200—OLED panel; 200a—second functional region; 200b—second peripheral region; 210—observation layer; 220—monitoring structure; 230—functional layer;

300—evaporation mask; 310—sheet mask; 310a—first functional region; 310b—first peripheral region; 311—first opening; 312—second opening; 320—support strip; 321—third opening; L3—first edge; L4—second edge;

400—OLED panel; 400a—second functional region; 400b—second peripheral region; 410—observation layer; 420—monitoring structure; and 430—functional layer.

DETAILED DESCRIPTION OF EMBODIMENTS

The evaporation mask, the OLED panel and system, and the evaporation monitoring method proposed in the present application will be described in greater detail below with reference to the drawings and specific embodiments. Advantages and features of the present application will become more apparent from the following description and claims. It should be noted that the drawings are presented in a very simplified form not precisely drawn to scale with the only purpose to facilitate convenience and clarity in explaining the embodiments of the present application.

Embodiment 1

Figure 1:
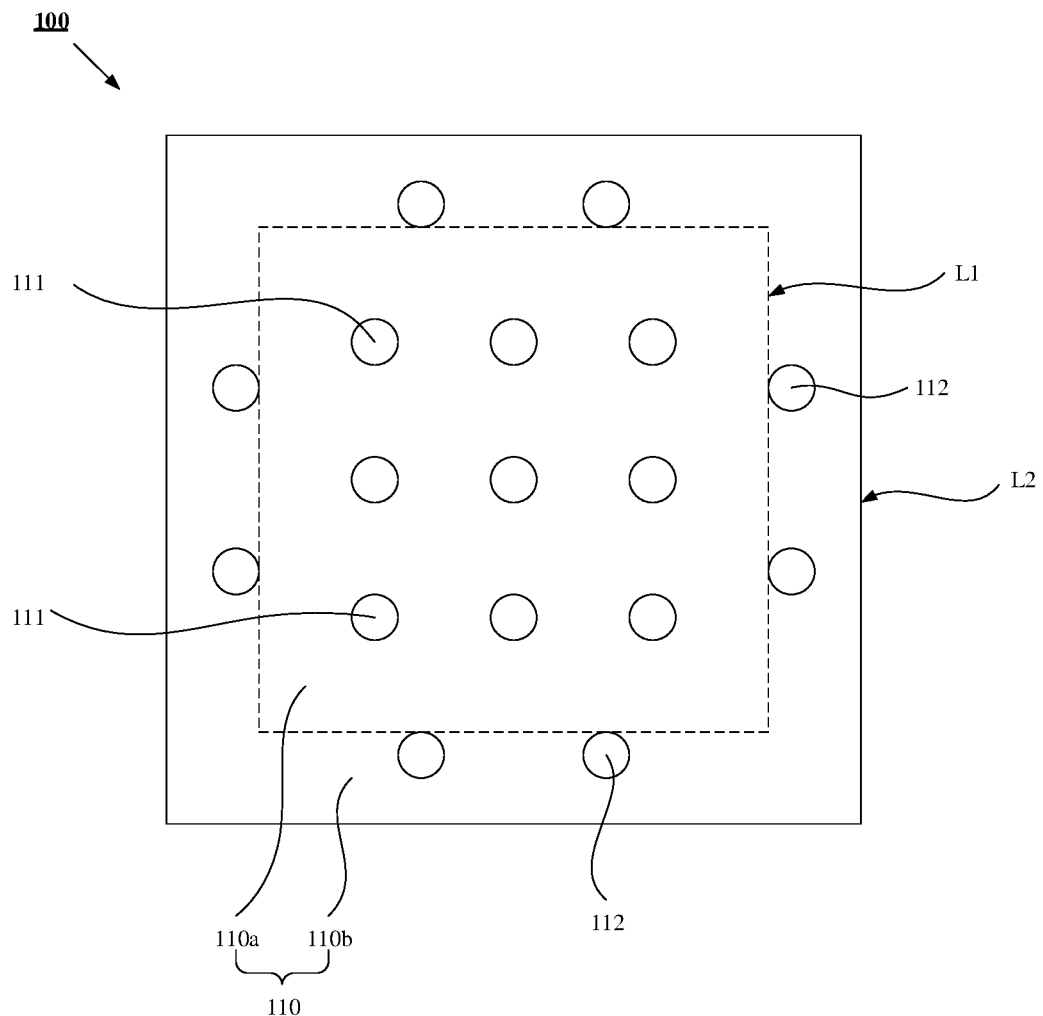
FIG. 1 is a schematic top view of an evaporation mask according to Embodiment 1 of the present application.

Please refer to FIG. 1, which is a structure diagram of an evaporation mask according to Embodiment 1 of the present application. As shown in FIG. 1, in the embodiment of the present application, the evaporation mask 100 includes a first functional region 110a and a first peripheral region 110b disposed outside of the first functional region 110a, the first functional region 110a defining first openings 111 for forming a functional layer by evaporation, and the first peripheral region 110b defining second openings 112 for monitoring an evaporation effect of the first openings 111. In the embodiment of the present application, the functional layer may be any material layer having a certain function and formed by an evaporation process. For example, the functional layer may be an organic material layer having certain capacity of transporting electrons and holes, or a metal layer having certain electrical conductivity, or a dielectric layer having certain insulating property, etc. In the embodiment of the present application, the first functional region 110a may be used for forming a display area of an OLED panel, and the first peripheral region 110b may be used for forming a non-display area of the OLED panel.

Preferably, the shape of the second openings 112 is substantially same to that of the first openings 111. For example, if the first openings 111 are square, the second openings 112 are also square. For another example, if the first openings 111 are circular, the second openings 112 are also circular. Further, the size of the second openings 112 is substantially same to that of the first openings 111. For example, when the first openings 111 and the second openings 112 are both square, side lengths of the both are equal. Thus, when the evaporation effect of the first openings 111 is monitored through the second openings 112, the monitoring result will be more accurate.

Still referring to FIG. 1, further, the first peripheral region 110b has a first edge L1 and a second edge L2, opposite to the first edge L1, on each side, wherein the first edge L1 is closer to the first functional region 110a than the second edge L2, and the second openings 112 are closer to the first edge L1 than to the second edge L2. Here, the second openings 112 are arranged as close as possible to the first functional region 110a, enabling the evaporation effect of the second openings 112 to be substantially consistent with the evaporation effect of the first openings 111, thus further improving the accuracy of the monitoring result.

In the embodiment of the present application, the evaporation mask 100 includes a sheet mask 110 including a first functional region 110a and a first peripheral region 110b disposed outside of the first functional region 110a, and the first openings 111 and the second openings 112 are both located on the sheet mask 110. Further, the evaporation mask 100 further includes a support strip (not shown), and the sheet mask 110 is fixed on the support strip. In the embodiment of the present application, the support strip exposes all the first openings 111 and all the second openings 112.

In the embodiment of the present application, the sheet mask 110 is rectangular. Further, the first functional region 110a is also rectangular, and the first peripheral region 110b is a rectangular ring. A plurality of second openings 112 are provided, being distributed in the first peripheral region 110b equably. For example, if eight second openings 112 are provided, two second openings 112 can be uniformly arranged on a strip region of each side of the first peripheral region 110b. The accuracy of the monitoring result is able to be further improved by monitoring the evaporation effect of the first openings 111 through the plurality of second openings 112.

In the embodiment of the present application, the first openings 111 are used for evaporating monochrome pixels, and the plurality of second openings 112 are used for monitoring the evaporation effect of pixels having the same color as the monochrome pixels evaporated through the first openings 111. For example, the first openings 111 are used for evaporating red pixels, and the plurality of second openings 112 are all used for monitoring the evaporation effect of the red pixels. For another example, the first openings 111 are used for evaporating blue pixels, and the plurality of second openings 112 are all used for monitoring the evaporation effect of the blue pixels.

In the embodiment of the present application, different evaporation masks 100 are often used for evaporating pixels of different colors. That is, when red pixels are evaporated, one evaporation mask 100 is used with the second openings 112 thereon being used for monitoring the evaporation effect of the red pixels; and when blue pixels are evaporated, another evaporation mask 100 is used with the second openings 112 thereon being used for monitoring the evaporation effect of the blue pixels. In this case, higher monitoring accuracy can be ensured, at the same time, the manufacturing cost of the evaporation mask 100 is increased.

Figure 2A:
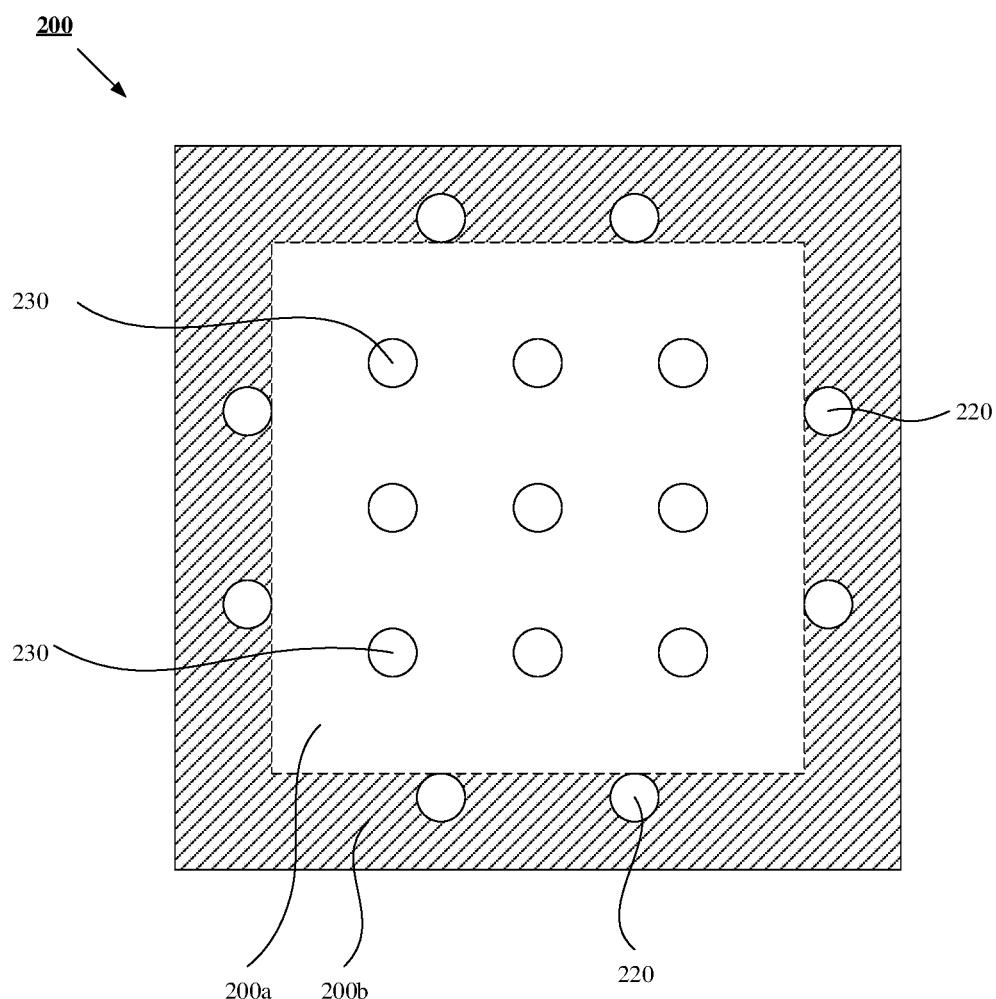
FIG. 2a is a schematic top view of an OLED panel according to Embodiment 1 of the present application.
Figure 2B:
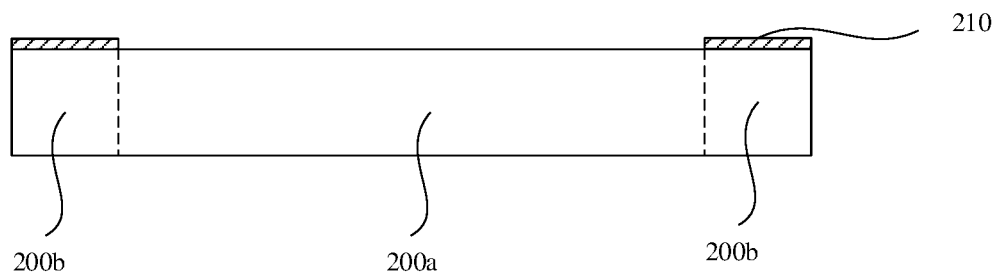
FIG. 2b is a schematic front view of the OLED panel according to Embodiment 1 of the present application.

Correspondingly, the present embodiment further provides an OLED panel. Specifically, please refer to FIG. 2a and FIG. 2b, wherein FIG. 2a is a schematic top view of an OLED panel according to Embodiment 1 of the present application, and FIG. 2b is a schematic front view of the OLED panel according to Embodiment 1 of the present application. As shown in FIG. 2a and FIG. 2b, the OLED panel 200 includes a second functional region 200a and a second peripheral region 200b disposed outside of the second functional region 200a, the second peripheral region 200b having an observation layer 210 formed thereon. Specifically, the OLED panel 200 may include a glass substrate including a second functional region and a second peripheral region, and the observation layer 210 may be formed on the glass substrate of the second peripheral region. In the embodiment of the present application, the second functional region 200a may be a display area, and the second peripheral region 200b may be a non-display area.

Please refer to FIG. 1, FIG. 2a and FIG. 2b, the present embodiment further provides an OLED panel system including the evaporation mask 100 and the OLED panel 200, wherein the evaporation mask 100 is located below the OLED panel 200, the first openings 111 of the evaporation mask 100 are used for forming a functional layer 230 on the second functional area 200a of the OLED panel 200 by evaporation, the second openings 112 of the evaporation mask 100 are used for forming monitoring structures 220 on the observation layer 210 of the OLED panel 200 by evaporation, and the monitoring structures 220 are used for monitoring the evaporation effect of the first openings 111.

In the embodiment of the present application, the monitoring structures 220 can be easily observed through the observation layer 210. For example, the material of the observation layer 210 is a reflective material, thus enabling highlighting of the monitoring structures 220 to make the monitoring structures 220 easily to be observed, in particular, easily to be captured by an optical device. For another example, the color of the observation layer 210 is greatly different from that of the monitoring structures 220, such that the monitoring structures 220 are easily captured by an optical device.

When the monitoring structures 220 are formed on the observation layer 210 of the OLED panel 200 by evaporation through the second openings 112 of the evaporation mask 100, (the contour of) the monitoring structures 220 are able to be easily captured, such that the evaporation effect of the first openings 111 is easily judged according to the monitoring structures 220.

Preferably, the thickness of the observation layer 210 is from 100 nm to 200 nm. For example, the thickness of the observation layer 210 may be 100 nm, 110 nm, 130 nm, 150 nm, 170 nm, 185 nm, or 200 nm, etc. At this thickness, the shape of the monitoring structures 220 is able to be captured more easily. Further, the observation layer 210 may be made of silver (Ag), indium tin oxide (ITO), etc.

Still referring to FIG. 2a and FIG. 2b, in the embodiment of the present application, the observation layer 210 covers the entire second peripheral region 200b. In other embodiments of the present application, the observation layer 210 may cover only a part of the second peripheral region 200b. Specifically, the region covered by the observation layer 210 corresponds to the region evaporated through the second openings 112, so that the monitoring structures 220 are able to be formed on the observation layer 210.

Preferably, the height difference between the surface of the second peripheral region 200b and the surface of the second functional region 200a is less than or equals to 200 nm. More preferably, the height difference between the surface of the second peripheral region 200b and the surface of the second functional region 200a is less than or equals to 100 nm. Thus, monitoring of the evaporation effect of the first openings 111 by the monitoring structures 220 formed on the observation layer 210 of the OLED panel 200 by evaporation through the second openings 112 of the evaporation mask 100 can be further improved.

Specifically, a film layer such as a silicon oxide layer, a silicon nitride layer, a titanium aluminum titanium layer, an organic adhesive layer or the like may be formed on the glass substrate of the second functional region 200a, and the thickness of the film may be from 5 μm to 10 μm. Correspondingly, a silicon oxide layer, a silicon nitride layer, a titanium aluminum titanium layer, an organic adhesive layer or the like may also be formed on the glass substrate of the second peripheral region 200b, and then the observation layer 210 is further formed thereon. The silicon oxide layer, the silicon nitride layer, the titanium aluminum titanium layer, the organic adhesive layer or the like on the glass substrate of the second peripheral region 200b may be formed at the same time as the silicon oxide layer, the silicon nitride layer, the titanium aluminum titanium layer, the organic adhesive layer or the like on the glass substrate of the second functional region 200a. Thus, height of the surface of the second peripheral region 200b and height of the surface of the second functional region 200a are ensured to be similar as well as an additional process step is able to be avoided.

In the embodiment of the present application, the monitoring structures 220 can be formed on the observation layer 210 of the OLED panel 200 by evaporation through the second openings 112 of the evaporation mask 100, and the evaporation effect of the first openings 111 of the evaporation mask 100 can be monitored through the monitoring structures 220, so that the evaporation effect is able to be monitored in time to achieve real-time on-line monitoring.

Correspondingly, the present embodiment further provides an evaporation monitoring method, including:

forming a functional layer 230 and monitoring structures 220 on the OLED panel 200 using the evaporation mask 100;

acquiring actual centers of the monitoring structures 220 on the OLED panel 200; and comparing the actual centers of the monitoring structures 220 with theoretical centers of the monitoring structures 220 to obtain an evaporation effect of first openings 111 of the evaporation mask 100.

The actual centers of the monitoring structures 220 on the OLED panel 200 can be acquired in the following way: capturing (the contour or boundary of) the monitoring structures 220 by an image capturing device (e.g., a camera or a video, etc.), and then calculating centers of the captured monitoring structures 220 according to the captured monitoring structures 220, i.e., acquiring the actual centers of the monitoring structures 220. It is readily known that after the contour or boundary of the monitoring structures 220 is obtained, the centers thereof are easily obtained by calculation. For example, if the monitoring structure 220 is square, the intersection of two diagonals is the center of the monitoring structure 220. For another example, if the monitoring structure 220 is circular, the center of circle thereof is the center of the monitoring structure 220.

In the embodiment of the present application, when the actual centers of the monitoring structures 220 and the theoretical centers of the monitoring structures 220 are at the same positions, the evaporation through the second openings 112 has no offset, thus inferring that the evaporation through the first openings 111 also has no offset; and when the actual centers of the monitoring structures 220 and the theoretical centers of the monitoring structures 220 are at different positions, the evaporation through the second openings 112 has offset, thus inferring that the evaporation through the first openings 111 also has offset. The comparison of positions of the actual centers and theoretical centers of the monitoring structures 220 can be achieved by comparing coordinates of the two.

Further, the above evaporation monitoring method can be implemented by a terminal device having an image capturing function and a calculation function, so that the entire evaporation monitoring is very convenient, efficient and accurate.

Further, the present embodiment also provides an evaporation adjusting method, including:

obtaining an evaporation effect of first openings 111 of the evaporation mask 100 on the OLED panel 200 using the above evaporation monitoring method; and adjusting the position of the evaporation mask 100 relative to the position of the OLED panel 200 when the evaporation through the first openings 111 has offset.

In the embodiment of the present application, for example, when the actual centers of the monitoring structures 220 and the theoretical centers of the monitoring structures 220 are compared and the actual centers of the monitoring structures 220 are found located on first sides of the theoretical centers of the monitoring structures 220, the position of the OLED panel 200 can be kept unchanged with the evaporation mask 100 being moved toward second sides, opposite to the first sides, of the theoretical centers, so that the adjustment of the evaporation mask 100 is able to be achieved to improve the subsequent evaporation effect.

To sum up, in the evaporation mask, the OLED panel and system, the evaporation monitoring method and adjusting method provided by the embodiment of the present application, monitoring structures can be formed on the observation layer of the OLED panel by evaporation through the second openings of the evaporation mask, and the evaporation effect of the first openings of the evaporation mask can be monitored through the monitoring structures, so that the evaporation effect is able to be monitored in time to achieve real-time on-line monitoring.

Embodiment 2

Figure 3A:
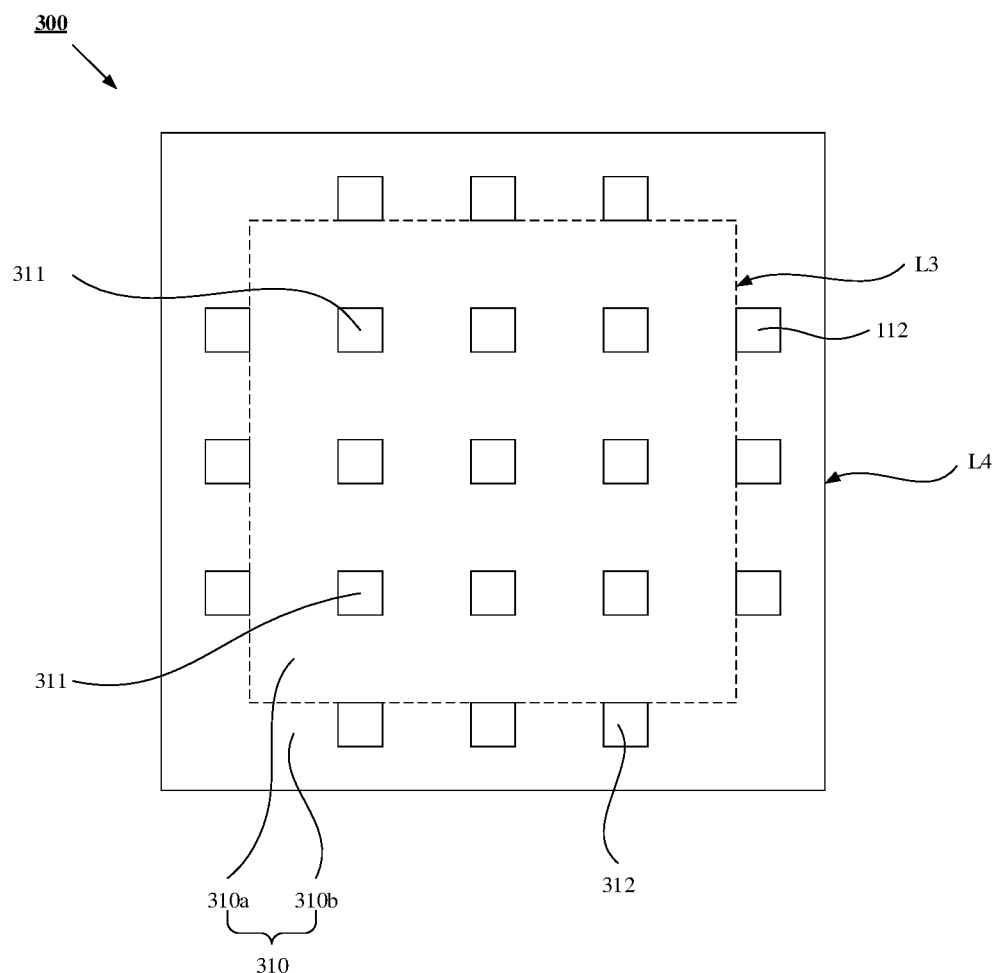
FIG. 3a is a schematic top view of a sheet mask in an evaporation mask according to Embodiment 2 of the present application.

Please refer to FIG. 3a, which is a schematic top view of a sheet mask in an evaporation mask according to Embodiment 2 of the present application. As shown in FIG. 3a, in the embodiment of the present application, the evaporation mask 300 includes a first functional region 310a and a first peripheral region 310b disposed outside of the first functional region 310a defining first openings 311 for forming a functional layer by evaporation, and the first peripheral region 310b defining second openings 312 for monitoring an evaporation effect of the first openings 311. In the embodiment of the present application, the functional layer may be any layer made of the material having a certain function and formed by an evaporation process. For example, the functional layer may be an organic layer having certain electron or hole transport capability, or a metal layer having certain electrical conductivity, or a dielectric layer having certain insulating property, etc. In the embodiment of the present application, the first functional region 310a may be used for forming a display area of an OLED panel, and the first peripheral region 310b may be used for forming a non-display area of the OLED panel.

Preferably, the shape of the second openings 312 is substantially same to that of the first openings 311. For example, if the first openings 311 are square, the second openings 312 are also square. For another example, if the first openings 311 are circular, the second openings 312 are also circular. Further, the size of the second openings 312 is substantially same to that of the first openings 311. For example, when the first openings 311 and the second openings 312 are both square, the side lengths of the two are equal; and when the first openings 311 and the second openings 312 are both circular, the diameters of the two are also equal. Thus, the monitoring result will be more accurate when the evaporation effect of the first openings 311 is monitored through the second openings 312.

Still referring to FIG. 3a, further, the first peripheral region 310b has a first edge L3 and a second edge L4, opposite to the first edge L3, on each side. The first edge L3 is closer to the first functional region 310a than the second edge L4 to the first functional region 310a, and the second openings 312 are closer to the first edge L3 than to the second edge L4. Here, the second openings 312 are arranged as close as possible to the first functional region 310a, so that the evaporation effect of the second openings 312 is substantially consistent with the evaporation effect of the first openings 311, thus further improving the accuracy of the monitoring result.

In the embodiment of the present application, the evaporation mask 300 includes a sheet mask 310 comprising a first functional region 310a and a first peripheral region 310b disposed outside of the first functional region 310a, and the first openings 311 and the second openings 312 are all located on the sheet mask 310.

In the embodiment of the present application, the sheet mask 310 is rectangular. Further, the first functional region 310a is also rectangular, and the first peripheral region 310b is a rectangular ring. A plurality of second openings 312 are provided, being distributed in the first peripheral region 310b equably. For example, if twelve second openings 312 are provided, three of the second openings 312 can be uniformly arranged on a strip region of each side of the first peripheral region 310b. The accuracy of the monitoring result is able to be further improved by monitoring the evaporation effect of the first openings 311 through the plurality of second openings 312.

In the embodiment of the present application, the first openings 311 are used for evaporating monochrome pixels, and the plurality of second openings 312 are used for monitoring the evaporation effects of pixels having different colors. For example, the first openings 311 are used for evaporating red pixels, and some of the second openings 312 are used for monitoring the evaporation effect of the red pixels. For another example, the first openings 311 are used for evaporating blue pixels, and some of the second openings 312 are used for monitoring the evaporation effect of the blue pixels.

In the embodiment of the present application, the same evaporation mask 300 can be used for evaporating pixels having different colors. That is, when red pixels are evaporated, an evaporation mask 300 is used, and some of the second openings 312 thereon are used for monitoring the evaporation effect of the red pixels; and when blue pixels are evaporated, the evaporation mask 300 is still used, and some of the second openings 312 thereon are used for monitoring the evaporation effect of the blue pixels, wherein some of the second openings 312 for monitoring the evaporation effect of the blue pixels is different from some of the second openings 312 for monitoring the evaporation effect of the red pixels (i.e., none of second openings is shared). In this case, not only can the evaporation effect of the first openings 311 be monitored, but also the manufacturing cost of the evaporation mask 300 is not increased.

In the embodiment of the present application, the plurality of second openings 312 are used for monitoring evaporation effects of different colors of pixels. For example, some of second openings 312 can be used for monitoring the evaporation effect of red pixels, some of the second openings 312 can be used for monitoring the evaporation effect of blue pixels, and some of the second openings 312 can be used for monitoring the evaporation effect of green pixels. Thus, when different colors of pixels are evaporated and the evaporation effects of the first openings 311 are monitored using the second openings 312, only some of the second openings 312 corresponding to the first openings 311 can be used, and the remaining second openings 312 non-corresponding to the first openings 311 are ignored.

Figure 3B:
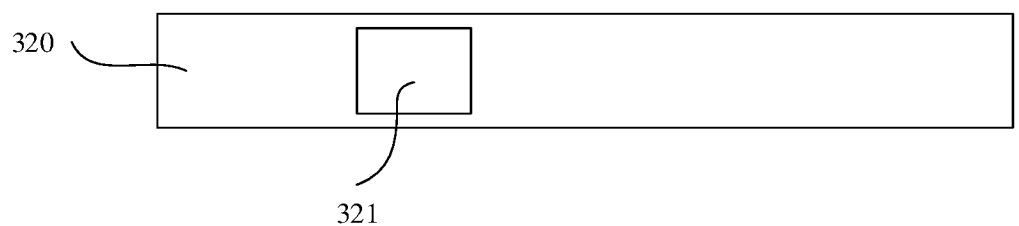
FIG. 3b is a schematic top view of a support strip in an evaporation mask according to Embodiment 2 of the present application.

Next, please refer to FIG. 3b, which is a schematic top view of a support strip in the evaporation mask according to Embodiment 2 of the present application. As shown in FIG. 3b, the evaporation mask 300 further includes a support strip 320 for supporting the sheet mask 310, wherein the support strip 320 has a third opening 321 exposing only some of the second openings 312, and the exposed second openings 312 are used for monitoring the evaporation effect of pixels having the same color as the monochrome pixels evaporated through the first openings 311. That is, in an implementation of the embodiment of the present application, the second openings 312 that are temporarily not used are sheltered by the support strip 320. For example, when the first openings 311 are used for evaporating red pixels, the third opening 321 of the support strip 320 exposes only some of the second openings 312 for monitoring the evaporation effect of the red pixels, some of the second openings 312 for monitoring the evaporation effect of blue pixels and some of the second openings 312 for monitoring the evaporation effect of green pixels are sheltered by the support strip 320. In this case, when different colors of pixels are evaporated, the support strip 320 is often replaced or changed such that the third openings 321 on the support strip 320 expose different ones of the second openings 312. Due to the relatively low cost of the support strip, this method is able to ensure high monitoring accuracy and relatively low cost.

Figure 4:
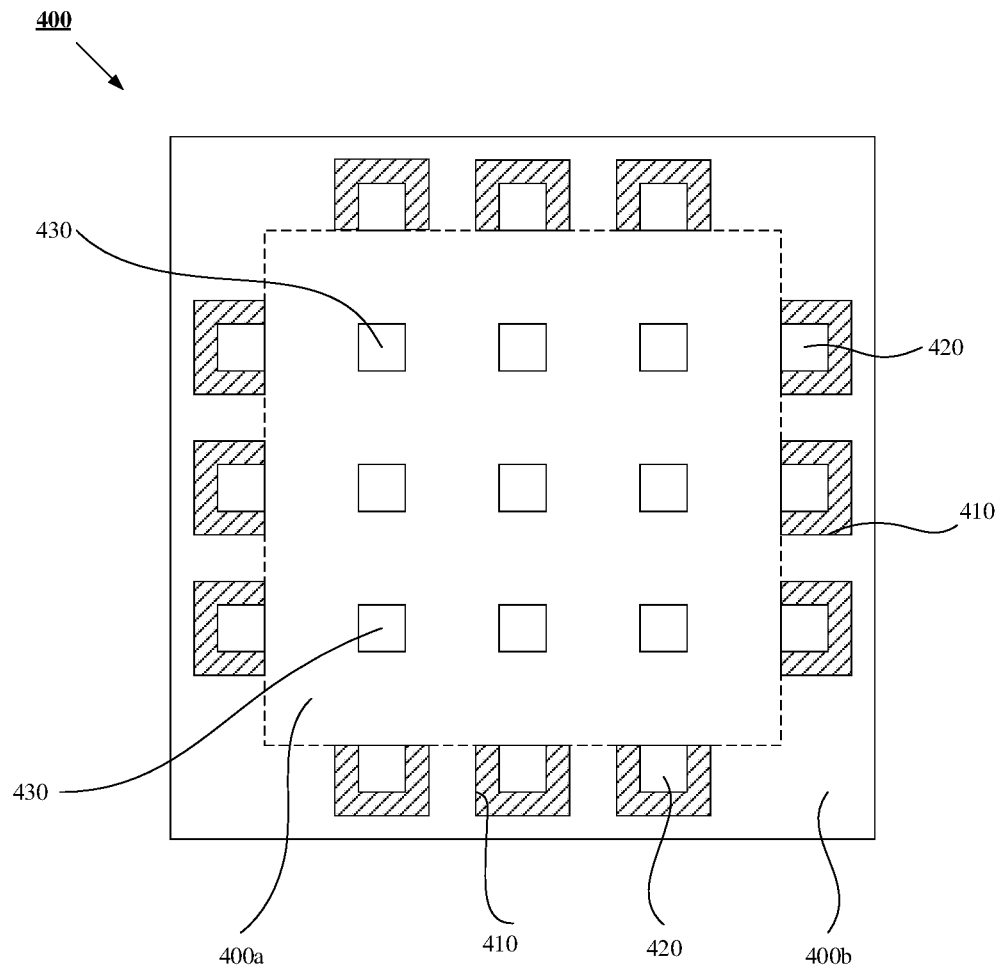
FIG. 4 is a schematic top view of an OLED panel according to Embodiment 2 of the present application.

Correspondingly, the present embodiment further provides an OLED panel. Specifically, please refer to FIG. 4, which is a schematic top view of an OLED panel according to Embodiment 2 of the present application. As shown in FIG. 4, the OLED panel 400 includes a second functional region 400a and a second peripheral region 400b disposed outside of the second functional region 400a, and an observation layer 410 is formed on the second peripheral region 400b. Specifically, the OLED panel 400 may include a glass substrate including a second functional region and a second peripheral region, and the observation layer 410 may be formed on the glass substrate of the second peripheral region. In the embodiment of the present application, the second functional region 400a may be a display area, and the second peripheral region 400b may be a non-display area.

Please refer to FIG. 3a, FIG. 3b and FIG. 4, the present embodiment further provides an OLED panel system including the evaporation mask 300 and the OLED panel 400, wherein the evaporation mask 300 is located below the OLED panel 400, the first openings 311 of the evaporation mask 300 are used for forming a functional layer 430 on the second functional area 400a of the OLED panel 400 by evaporation, the second openings 312 of the evaporation mask 300 are used for forming monitoring structures 420 on the observation layer 410 of the OLED panel 400 by evaporation, and the monitoring structures 420 are used for monitoring the evaporation effect of the first openings 311.

In the embodiment of the present application, the monitoring structures 420 are able to be easily observed through the observation layer 410. For example, the material made of the observation layer 410 is reflective to enable highlighting of the monitoring structures 420, thus enabling the monitoring structures 420 to be easily observed, and particularly, to be easily captured by an optical device. For another example, the color of the observation layer 410 is greatly different from that of the monitoring structures 420, thus enabling the monitoring structures 420 to be easily captured by the optical device.

When the monitoring structures 420 are formed on the observation layer 410 of the OLED panel 400 by evaporation through the second openings 312 of the evaporation mask 300, (the contour of) the monitoring structures 420 are able to be easily captured, such that the evaporation effect of the first openings 311 are able to be easily judged according to the monitoring structures 420.

Preferably, the thickness of the observation layer 410 is from 100 nm to 200 nm. For example, the thickness of the observation layer 410 may be 100 nm, 110 nm, 130 nm, 150 nm, 170 nm, 185 nm, or 200 nm, etc. At this thickness, the shape of the monitoring structures 420 is able to be captured more easily. Further, the observation layer 410 may be made of silver (Ag), indium tin oxide (ITO), etc.

Still referring to FIG. 4, in the embodiment of the present application, the observation layer 410 covers only a part of the second peripheral region 200b. Specifically, the region covered by the observation layer 410 corresponds to the region evaporated through the second openings 312, and preferably, the region covered by the observation layer 410 is greater than or equals to the region evaporated through the second openings 312, so that the monitoring structures 420 are able to be formed on the observation layer 410. In other embodiments of the present application, the observation layer 410 may also cover the entire second peripheral region 400b.

Preferably, the height difference between the surface of the second peripheral region 400b and the surface of the second functional region 400a is less than or equals to 200 nm. More preferably, the height difference between the surface of the second peripheral region 400b and the surface of the second functional region 400a is less than or equals to 100 nm. Thus, monitoring of the evaporation effect of the first openings 311 by the monitoring structures 420 formed on the observation layer 410 of the OLED panel 400 by evaporation through the second openings 312 of the evaporation mask 300 can be further improved.

Specifically, a film such as a silicon oxide layer, a silicon nitride layer, a titanium aluminum titanium layer, an organic adhesive layer or the like may be formed on the glass substrate of the second functional region 400a, and the thickness of the film may be from 5 μm to 10 μm. Correspondingly, a silicon oxide layer, a silicon nitride layer, a titanium aluminum titanium layer, an organic adhesive layer or the like may also be formed on the glass substrate of the second peripheral region 400b, and then the observation layer 410 is further formed thereon. The silicon oxide layer, the silicon nitride layer, the titanium aluminum titanium layer, the organic adhesive layer or the like on the glass substrate of the second peripheral region 400b may be formed at the same time as the silicon oxide layer, the silicon nitride layer, the titanium aluminum titanium layer, the organic adhesive layer or the like on the glass substrate of the second functional region 400a. Thus, height of the surface of the second peripheral region 400b and that of the surface of the second functional region 400a are ensured to be similar, as well as an additional process steps is able to be avoided.

In the embodiment of the present application, the monitoring structures 420 can be formed on the observation layer 410 of the OLED panel 400 by evaporation through the second openings 312 of the evaporation mask 300, and the evaporation effect of the first openings 311 of the evaporation mask 300 can be monitored through the monitoring structures 420, so that the evaporation effect is able to be monitored in time to achieve real-time on-line monitoring.

Correspondingly, the present embodiment further provides an evaporation monitoring method, including:

forming a functional layer 430 and monitoring structures 420 on the OLED panel 400 using the evaporation mask 300;

acquiring actual centers of the monitoring structures 420 on the OLED panel 400; and comparing the actual centers of the monitoring structures 420 with theoretical centers of the monitoring structures 420 to obtain an evaporation effect of first openings 311 of the evaporation mask 300.

The actual centers of the monitoring structures 420 on the OLED panel 400 can be acquired in the following way: capturing (the contour or boundary of) the monitoring structures 420 by an image capturing device (e.g., a camera or a video, etc.), and then calculating centers of the captured monitoring structures 420 according to the captured monitoring structures 420, i.e., acquiring the actual centers of the monitoring structures 420. It is readily known that after the contour or boundary of the monitoring structures 420 is obtained, the centers thereof are easily obtained by calculation. For example, if the monitoring structure 420 is square, the intersection of two diagonals is the center of the monitoring structure 420. For another example, if the monitoring structure 420 is circular, the center of circle thereof is the center of the monitoring structure 420.

In the embodiment of the present application, when the actual centers of the monitoring structures 420 and the theoretical centers of the monitoring structures 420 are at the same positions, the evaporation through the second openings 312 has no offset, thus inferring that the evaporation through the first openings 311 also has no offset; and when the actual centers of the monitoring structures 420 and the theoretical centers of the monitoring structures 420 are at different positions, the evaporation through the second openings 312 has offset, thus inferring that the evaporation through the first openings 311 also has offset. The comparison of positions of the actual centers and theoretical centers of the monitoring structures 420 can be achieved by comparing coordinates of the two.

Further, the above evaporation monitoring method can be implemented by a terminal device having an image capturing function and a calculation function, so that the entire evaporation monitoring is very convenient, efficient and accurate.

Further, the present embodiment also provides an evaporation adjusting method, including: obtaining an evaporation effect of first openings 311 of the evaporation mask 300 on the OLED panel 400 using the above evaporation monitoring method; and adjusting the position of the evaporation mask 300 relative to the position of the OLED panel 400 when the evaporation through the first openings 311 has offset.

In the embodiment of the present application, for example, when the actual centers of the monitoring structures 420 and the theoretical centers of the monitoring structures 420 are compared and the actual centers of the monitoring structures 420 are found located on first sides of the theoretical centers of the monitoring structures 420, the position of the OLED panel 400 can be kept unchanged with the evaporation mask 300 being moved toward second sides, opposite to the first sides, of the theoretical centers, so that the adjustment of the evaporation mask 300 is able to be achieved to improve the subsequent evaporation effect.

To sum up, in the evaporation mask, the OLED panel and system, the evaporation monitoring method and adjusting method provided by the embodiment of the present application, monitoring structures can be formed on the observation layer of the OLED panel by evaporation through the second openings of the evaporation mask, and the evaporation effect of the first openings of the evaporation mask can be monitored through the monitoring structures, so that the evaporation effect is able to be monitored in time to achieve real-time on-line monitoring.

Described above are merely preferred embodiments of the present application, and the scope of the present application is not limited in any way. Any change or modification made by those skilled in the art concerning the foregoing disclosure fall within the scope of the appended claims.

What is claimed is:

1. An organic light-emitting diode (OLED) panel, comprising: a second functional region comprising a plurality of film layers on a substrate, and a second peripheral region comprising a plurality of film layers, which are same to that in the second functional region, and disposed outside of the second functional region, and the second peripheral region further comprises an observation layer on the plurality of film layers, the second functional region having a functional layer formed thereon by evaporation through at least one first opening of an evaporation mask, the observation layer of the OLED panel having at least one monitoring structure formed thereon by evaporation through at least one second opening of the evaporation mask, an evaporation effect of the at least one first opening being monitored via the monitoring structure.

2. The OLED panel of claim 1, wherein the observation layer is made of a reflective material.

3. The OLED panel of claim 1, wherein a thickness of the observation layer is from 100 nm to 200 nm, and a height difference between a surface of the second peripheral region and a surface of the second functional region is less than or equals to 200 nm.

4. A method for evaporation monitoring, comprising:
providing an evaporation mask, the evaporation mask comprising a first functional region and a first peripheral region disposed outside of the first functional region, the first functional region defining at least one first opening, the first peripheral region defining at least one second opening;
providing an OLED panel, the OLED panel comprising: a second functional region comprising a plurality of film layers on a substrate, and a second peripheral region comprising a plurality of film layers, which are same to that in the second functional region, on the substrate and disposed outside of the second functional region, and the second peripheral region further comprises an observation layer on the plurality of film layers;
forming a functional layer and at least one monitoring structure on the second functional region and the observation layer of the OLED panel respectively using the evaporation mask;
capturing a contour or boundary of the at least one monitoring structures and calculating an actual center of the at least one monitoring structure on the OLED panel; and
comparing the actual center of the monitoring structure with a theoretical center of the monitoring structure to obtain an evaporation effect of the at least one first opening of the evaporation mask.

5. The method for evaporation monitoring of claim 4, wherein the evaporation through the at least one first opening is considered to have no offset when the actual center of the monitoring structure and the theoretical center of the monitoring structure are at the same position, and the evaporation through the at least one first opening is considered to have offset when the actual center of the monitoring structure and the theoretical center of the monitoring structure are at different positions.

6. The OLED panel of claim 1, wherein a color of the observation layer is greatly different from a color of the monitoring structures formed on the observation layer.

7. The method for evaporation monitoring of claim 4, wherein the comparison of actual centers and theoretical centers of the monitoring structures is achieved by comparing coordinates of the two.

8. The OLED panel of claim 1, wherein the plurality of film layers on the second peripheral region are formed at the same time as the plurality of film layers on the second functional region.

9. The OLED panel of claim 1, wherein the observation layer is configured to cover a whole of the second peripheral region.

10. The OLED panel of claim 1, a height of the surface of the second peripheral region is higher than a height of the surface of the second functional region.

11. The OLED panel of claim 1, wherein the plurality of film layers on the second peripheral region comprises a silicon oxide layer, a silicon nitride layer, a titanium aluminum titanium layer and an organic adhesive layer, and the plurality of film layers on the second functional region comprises a silicon oxide layer, a silicon nitride layer, a titanium aluminum titanium layer and an organic adhesive layer.

12. The OLED panel of claim 1, the plurality of film layers on the second peripheral region and the plurality of film layers on the second functional region have a same number of film layers.

13. The OLED panel of claim 1, wherein a plurality of monitoring structures are formed on the observation layer, and the plurality of monitoring structures formed on the observation layer are uniformly arranged surrounding the second functional region.

14. The OLED panel of claim 1, a height of the surface of the second peripheral region excluding a height of the observation layer is similar to a height of the surface of the second functional region.

* * * * *